(12) United States Patent
Wang

(10) Patent No.: US 6,801,035 B2
(45) Date of Patent: Oct. 5, 2004

(54) METHOD FOR GENERATING IMAGES BY MEANS OF MAGNETIC RESONANCE

(75) Inventor: Jianmin Wang, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 10/171,339

(22) Filed: Jun. 12, 2002

(65) Prior Publication Data

US 2003/0001571 A1 Jan. 2, 2003

(30) Foreign Application Priority Data

Jun. 13, 2001 (DE) .......................................... 101 28 534

(51) Int. Cl.[7] .............................. G01V 3/00; A61B 5/05
(52) U.S. Cl. .......................... 324/309; 324/307; 600/410
(58) Field of Search ................................ 324/312, 309, 324/307, 318; 600/410, 422

(56) References Cited

U.S. PATENT DOCUMENTS

| | | | | |
|---|---|---|---|---|
| 5,086,275 A | * | 2/1992 | Roemer ....................... | 324/309 |
| 5,109,854 A | * | 5/1992 | Provost ....................... | 600/410 |
| 6,160,398 A | * | 12/2000 | Walsh ......................... | 324/309 |
| 6,326,786 B1 | * | 12/2001 | Pruessmann et al. ....... | 324/312 |
| 6,564,082 B2 | * | 5/2003 | Zhu ............................ | 600/410 |
| 2002/0158632 A1 | * | 10/2002 | Sodickson ................... | 324/307 |
| 2002/0167315 A1 | * | 11/2002 | Kellman et al. ............. | 324/307 |
| 2003/0001571 A1 | * | 1/2003 | Wang .......................... | 324/309 |
| 2003/0004408 A1 | * | 1/2003 | Zhu ............................ | 600/410 |
| 2003/0004410 A1 | * | 1/2003 | Zhu ............................ | 600/422 |

FOREIGN PATENT DOCUMENTS

WO     WO 99/54746     10/1999

OTHER PUBLICATIONS

"Fast MRI Data Acquisition Using Multiple Detectors," Hutchinson et al., Magnetic Resonance in Medicine, vol. 6 (1988) pp. 87–91.
"SENSE Image Quality Improvement Using Matrix Regularization," King et al., Proc. Intl. Soc. Mag. Reson. Med., vol. 9 (2001) p. 1771.
"An Algorithm for Rapid Image Acquisition Using Multiple Receiver Coils," Kelton et al., Proceedings of the SMRM 8th Annual Meeting, Amsterdam, 1989, p. 1172.

* cited by examiner

Primary Examiner—Diego Gutierrez
Assistant Examiner—Tiffany A. Fetzner
(74) Attorney, Agent, or Firm—Schiff Hardin LLP

(57) ABSTRACT

In a method for image generation by means of magnetic resonance, employing a number of independent reception antennas having sensitivity profiles differing from one another, radio-frequency excitation pulses and gradient pulses are emitted into an imaging region, the imaging region which is divided into partial imaging regions, for generating location-coded magnetic resonance signals, the gradient pulses including phase-coding gradients for the location coding in a phase-coding direction, with the location coding in the phase-coding direction being incomplete. The magnetic resonance signals are simultaneously received with the reception antennas, and respective k-space datasets are formed from the reception signals of the reception antenna. An intermediate image is reconstructed from each k-space dataset, the intermediate images including fold-over artifacts due to the incomplete location coding in the phase-coding direction. A fold-over artifact-free, overall image is formed by a weighted combination of the intermediate images with weighting matrices allocated to the antennas. The weighting matrices are determined by taking into account the fold-over artifacts and noise.

8 Claims, 4 Drawing Sheets

METHOD FOR GENERATING IMAGES BY MEANS OF MAGNETIC RESONANCE

BACKGROUND OF THE INVENTION

1. Field of the Invention

The present invention is directed to a method for image generation by means of magnetic resonance, of the type wherein a number of independent reception antennas having sensitivity profiles differing from one another are employed for generating an overall image.

2. Description of the Prior Art

PCT Application WO 99154746 discloses a method of this type wherein radio-frequency excitation pulses and gradient pulses are emitted in an imaging region, the imaging region being divided into partial imaging regions, for generating location-coded magnetic resonance signals, with the gradient pulses including phase-coding gradients for the location coding in a phase-coding direction, with the location coding in phase-coding direction being incomplete. The magnetic resonance signals are simultaneously received with the reception antennas, and a k-space dataset is formed from the reception signals of each reception antenna.

An intermediate image is reconstructed from each k-space dataset. The intermediate images include fold-over artifacts due to the incomplete location coding in the phase-coding direction.

A weighted combination of the intermediate images ensues with weighting matrices allocated to the antennas to form a fold-over artifact-free, overall image.

The time required for the generation of a magnetic resonance image using measurement sequences that are standard, and with a given size and resolution of the image is determined by the intensity of the gradient magnetic field employed for the topical resolution. Although the gradient coils with which the gradient magnetic field is generated are becoming increasingly powerful and the measurements are becoming increasingly faster as a result thereof, a physiologically prescribed limit (stimulation limit) that cannot be exceeded exists because of the magnetic fields that are rapidly switched and due to the electrical voltages that are induced in the tissue of the patient as a result.

In recent years, methods have been developed that are referred to as coil sensitivity encoding methods or partial parallel acquisition (PPA). These methods use sensitivity profiles of the individual antennas of an antenna array in order to reduce the phase-coding steps required for the topical resolution, and thus shorten the measurement time.

The article by Hutchison and Raff, "Fast MRI Data Acquisition Using Multiple Detectors", Magnetic Resonance in Medicine, Vol. 6, pp. 87–91 (1988) discloses a method wherein only one phase-coding step is required for the production of an image. An antenna array is used that has a number of independent individual antennas and radio-frequency channels that corresponds exactly to the number of phase-coding steps in conventional sequential phase coding with phase-coding gradient fields. Due to the high required number of reception channels, this method is difficult to practically implement.

The article by James R. Kelton, Richard L. Magin, Steven M. Wright, "An Algorithm for Rapid Image Acquisition Using Multiple Receiver Coils", Proceedings of the SMRM 8th Annual Meeting, Amsterdam, 1989, p. 1172, discloses a measurement method wherein the idea of Hutchison and Raff was expanded. The number of individual antennas in the antenna array amounts to a power of two therein. The measuring time is shortened dependent to this number of antennas. The number of independent radio-frequency reception channels can be selected significantly lower than the number of phase-coding steps otherwise required for the image determination.

As noted above, a parallel acquisition method of the type initially disclosed in PCT Application WO 99/54746. For determining the antenna sensitivity profiles required for the reconstruction of the final image, a reference measurement with the same or even with a lower resolution than in the actual image production is implemented before the actual exposure. To that end, the magnetic resonance signals are measured with the individual antennas in the antenna array as well as with the whole-body antenna permanently installed in the magnetic resonance apparatus. The sensitivity profile of the whole-body antenna is constant enough in order to be used as a reference. The complex images (in the mathematical sense) of the individual antennas obtained after the Fourier transformation and the reference image of the whole-body antenna are placed into relationship with one another, and the complex (in the mathematical sense) sensitivity profiles of the individual antennas are obtained. After determining the weighting matrices from the antenna sensitivity profiles, these weighting matrices are then employed for reconstruction in the following, actual measurement.

For the parallel acquisition technique, it is important to identify exactly the antenna sensitivity profiles employed for the reconstruction from in vivo measurements. The intensity of the magnetic resonance signals from voxels corresponding to the picture elements in the examination region is decisive. The calculation of the antenna sensitivity profiles is no longer trivial for picture elements that represent only weakly imaging tissue.

Heretofore, the signal intensity of the magnetic resonance exposures from a reference scan or a pre-scan, used for determining the weighting matrices was compared to a threshold in order to determine whether imaging tissue was present for the presentation of the picture element in question. When the signal intensity is higher than the threshold, i.e. when imaging tissue is present, the antenna sensitivity profiles and the weighting matrices are calculated from the measured signals in order then to be employed for the reconstruction. Conversely, when no tissue or only weakly imaging tissue is present at the picture element in question, the picture element must be estimated by interpolation or extrapolation. The aforementioned PCT Application WO 99/54756 discloses a possibility for interpolating or extrapolating the missing antenna sensitivity profiles from the neighboring picture elements. This method, however, also involves some disadvantages. When the threshold lies very high, many picture elements are interpreted as noise and these picture elements must be interpolated or extrapolated. The interpolation or extrapolation is very difficult to implement in this case. This can lead to fold-over artifacts in the final image that are still visible after the reconstruction. When the threshold lies very low, the calculated antenna sensitivity profiles are very highly influenced by noise. The reconstruction no longer supplies weighting matrices that are optimized in terms of signal-to-noise. The signal intensities outside the patient contour must be extrapolated because of the lack of imaging substance. This extrapolation can be unstable. Further, the calculation is correspondingly involved in terms of calculating time.

SUMMARY OF THE INVENTION

An object of the present invention is to provide a method for fast image generation, wherein the weighting matrices for the fold-over artifact-free overall image can be dependably determined.

The object is achieved in a method as initially described wherein the weighting matrix is determined from a fold-over artifact-free intermediate weighting images acquired with the reception antennas, such that noise and the sum of fold-over artifacts due to incomplete location coding in the phase-coding direction is minimized in the reconstructed overall image, with the overall image being composed of the intermediate weighting images weighted with the elements to be defined in the weighting matrix.

It is advantageous that the antenna sensitivity profiles now no longer need to be smoothed or extrapolated, since errors in the extrapolation can lead to artifacts in the final image. Further, the signal-to-noise loss that is otherwise present due to parallel acquisition can be reduced. In known parallel acquisition methods, the ratio of signal to noise is optimized dependent on the condition that the fold-over artifacts are completely suppressed. In the present case, in contrast, the ratio of signal to noise is optimized together with the fold-over artifacts. The signal-to-noise ratio thus is improved for image regions having only slight fold-over artifacts.

In an embodiment the fold-over artifact-free intermediate weighting images for determining the weighting matrices and the magnetic resonance signals for the overall image are acquired with the same image sequence, with the location coding in the phase-coding direction being complete in the low-frequency region and incomplete in the adjacent higher-frequency region. A separate pre-scan for determining the weighting matrices thus can be foregone; the weighting matrices are determined from the middle region of completely occupied k-space. When the middle region of k-space and the adjacent higher-frequency regions are occupied with the same sequence type, differences in the contrast of the images for determining the weighting matrices and for producing the actual magnetic resonance image do not occur.

DESCRIPTION OF THE PREFERRED EMBODIMENTS

Figure 1:
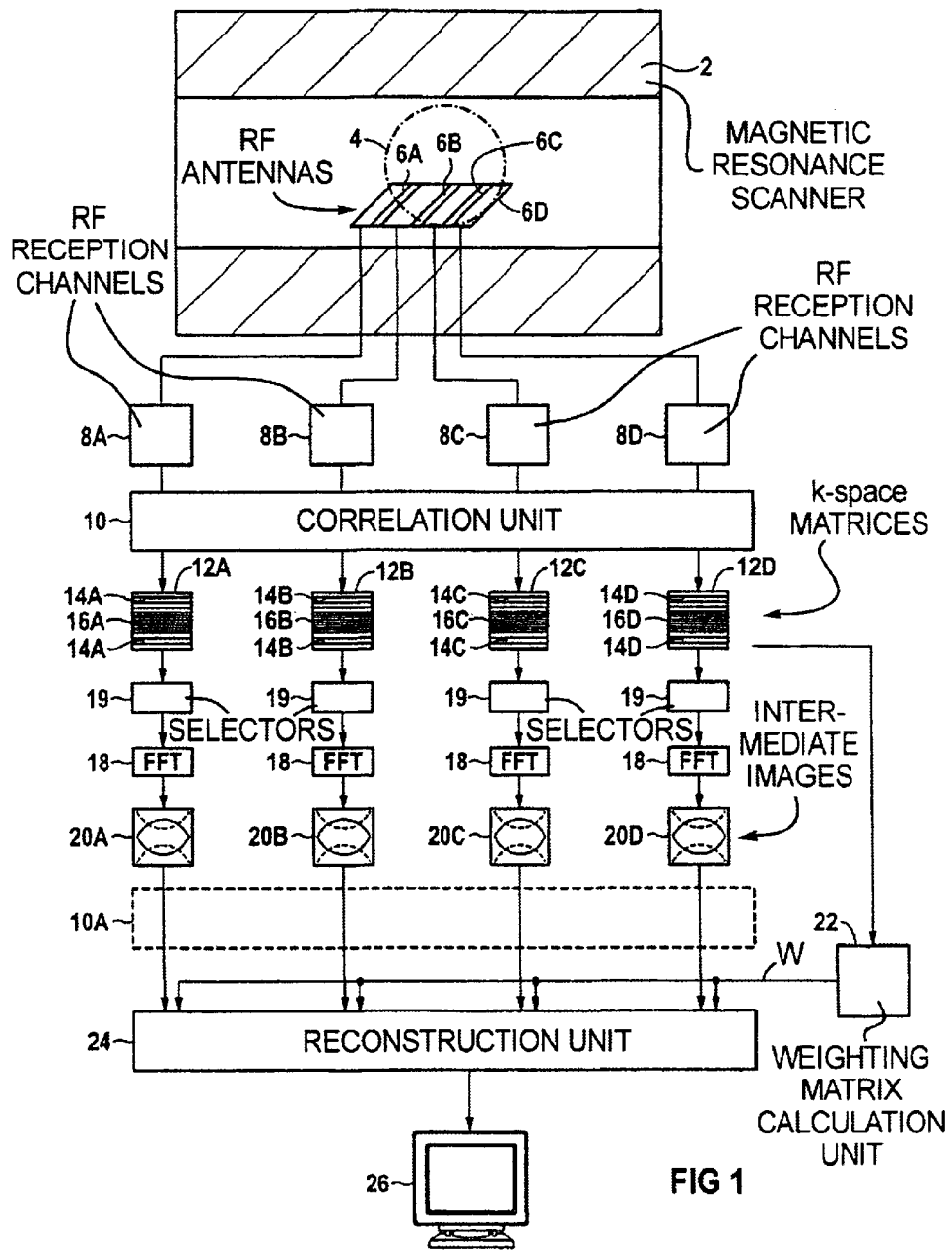
FIG. 1 is an overview showing the basic steps in the signal processing for fast magnetic resonance imaging constructed and operating in accordance with the invention.

FIG. 1 schematically shows a diagnostic magnetic resonance scanner 2 having a basic magnetic field generating device for generating a uniform magnetic field in an imaging volume 4, a gradient system for generating magnetic gradient fields in three spatial directions residing perpendicularly on one another, a radio-frequency antenna system for exciting and receiving the magnetic resonance signals, as well as a control unit for controlling the individual components in the magnetic resonance apparatus. Dependent on a selected sequence, the magnetic gradient fields are activated at predetermined time intervals with a predetermined intensity for location coding of the magnetic resonance signals. A distinction is made between a slice selection gradient, a phase-coding gradient and a frequency-coding gradient. In many sequences, only the nuclei in one slice are excited by the slice-coding gradient field being simultaneously activated with a radio-frequency excitation pulse. A further location coding then ensues in a phase-coding direction in the excited layer by activating the phase-coding gradient. The phase of the magnetic resonance signal is determined by the gradient-time area of the phase-coding gradient. Finally, frequency coding in a direction perpendicular to the phase coding ensues upon reception of the magnetic resonance signal by activating the frequency-coding gradient.

The radio-frequency antenna system includes a whole-body antenna that is fashioned for exciting as well as for receiving the magnetic resonance signals. Additionally, an antenna array 6 is present with individual antennas 6A, 6B, 6C, 6D that are independent of one another and that, in contrast to the whole-body antenna, can only image a limited region. This is exploited in a fast magnetic resonance imaging method with parallel data acquisition wherein the location coding in phase-coding direction no longer completely ensues by means of phase-coding gradients. These methods are known, for example from the initially cited WO 99/54746. The individual antennas 6A, 6B, 6C, 6D are respectively connected to independent radio-frequency channels 8A, 8B, 8C, 8D, wherein amplification, phase-sensitive demodulation and digitization of the magnetic resonance signals received by the individual antennas 6A, 6B, 6C, 6D ensue.

The reception channels 8A, 8B, 8C, 8D are connected to a correlation unit 10 wherein the signals further-processed by the reception channels are de-correlated with respect to noise. An optimum signal-to-noise ratio thus is achieved in the following reconstruction, which shall be described in detail below. To that end, a noise correlation matrix COR is used that was previously determined from pure noise reception signals of the individual antennas 6A, 6B, 6C, 6D. A de-correlation matrix K is determined from an inverted matrix $COR^{-1}$ for the noise correlation matrix COR, the de-correlation matrix K containing weighting factors in order to de-correlate the actual payload signals from one another with respect to the noise. For determining this de-correlation matrix, noise reception signals $X1(t)$, $X2(t)$, $X3(t)$, $X4(t)$ of the individual antennas 6A, 6B, 6C, 6D are further processed according to the following, general relationships following a phase-sensitive demodulation.

The noise reception signals $X1(t)$, $X2(t)$, $X3(t)$, $X4(t)$ can be represented as a column vector $X(t)$. The elements of the noise correlation matrix COR can be formed by a matrix product of the column vector $X(t)$ with a row vector $X^*(t)$, whose components are the complex-conjugated noise reception signals $X(t)$, and can be determined via a following integration over the time. The de-correlation matrix K with the weighting factors for noise de-correlation of the actual measured signals is derived from the root of the inverted noise correlation matrix COR-1.

The reception signals are then read into the appertaining rows of respective k-space matrices 12A, 12B, 12C, 12D dependent on their phase coding prescribed by the phase-coding gradient, and thus respectively form k-space datasets. The number of phase-coding steps is reduced for the regions of higher spatial frequencies, i.e. in outer regions 14A, 14B, 14C, 14D, compared to conventional sequences. The rows in these regions of the k-space matrices 12A, 12B, 12C, 12D thus are not completely occupied with signals. In contrast thereto, k-space is completely occupied in the regions of low spatial frequencies, i.e. in the middle k-space regions 16A, 16B, 16C, 16D. Via a fast Fourier transformation 18, respective intermediate images 20A, 20B, 20C, 20D are generated from the k-space datasets. Although the middle k-space regions 15A, 16B, 16C, 16D are completely occupied with data, only rows that, corresponding to the outer regions 14A, 14B, 14C, 14D, represent an under-sampling in the phase-coding direction are employed for the reconstruction here. The selection of the rows needed for this purpose ensues in a selector 19. The intermediate images 20A, 20B, 20C, 20D exhibit convolutions in the phase-coding direction because of the under-sampling. For example, a circular structure in the image would be superimposed by two shifted semi-circles, as shown highly schematically in FIG. 1.

Instead of being applied in the spatial frequency space, the noise de-correlation also can be applied to the intermediate images 20A, 20B, 20C, 20D in the image space with the same result, as described above. The correlation unit 10 in FIG. 1 is then eliminated; a correspondingly adapted correlation unit 10A that is shown with broken lines in FIG. 1 is employed instead.

Using the data of the middle k-space regions 16 A, 16B, 16C, 16D a weighting matrix W is determined in a weighting matrix calculation unit 22. The weighting matrix W in turn is used to generate a fold-over artifact-free overall image 26 of the examination region is generated from the intermediate images 20A, 20B, 20C, 20D in a reconstruction unit 24. The reconstruction method proceeds essentially by determining the values for the picture elements of the overall image 26 by a weighted summation of the values of the corresponding picture elements of all intermediate images 20A, 20B, 20C, 20D. The weighting factors representing the matrix are derived from the intermediate weighting images of the individual antennas 6A, 6B, 6C, 6D.

All sequences that already have a short measurement duration in and of themselves are particularly suited as a measurement sequence in the context of the invention in order to further reduce the measurement time proceeding from these sequences. For example, EPI or FISP sequences are well suited for this reason.

In a FISP sequence (Fast Imaging With Steady Precession), for example, a high-amplitude signal, even with short pulse repetition times is achieved by means of a complete re-phasing of the spins. A refocusing gradient pulse is applied in phase-coding direction.

Figure 2:
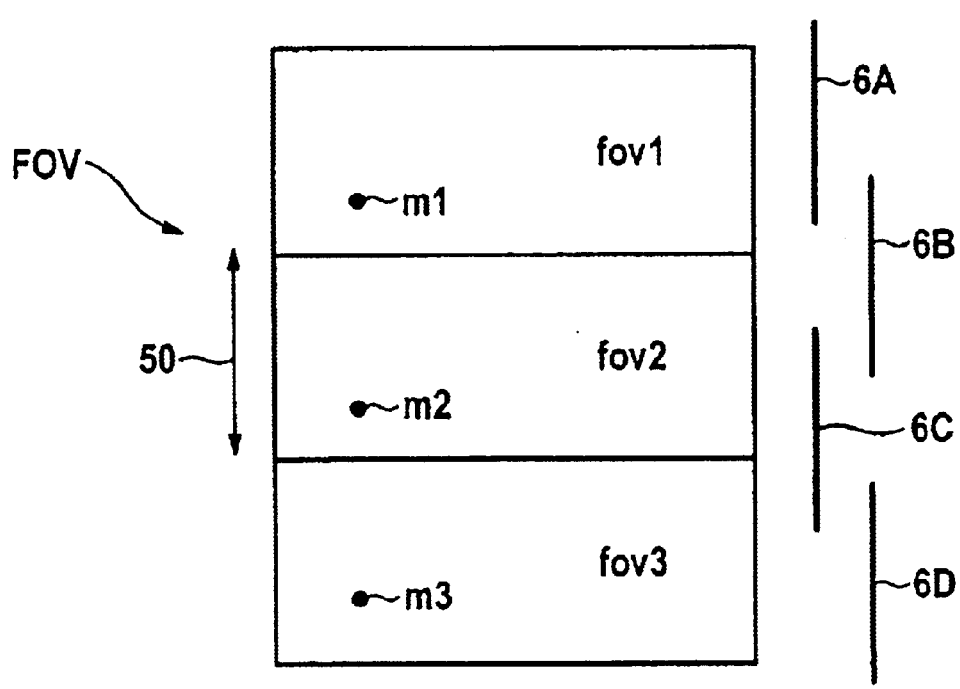
FIG. 2 is a schematic illustration of a division of the imaging region into three partial regions in accordance with the invention.

In order to elaborate on the principle of the present invention, the previous reconstruction shall be explained first on the basis of FIG. 2.

An antenna array having nCh independent individual antennas 6A, 6B, 6C, 6D is assumed. The imaging region FOV is divided into nFov smaller sub-regions fov1, fov2, fov3. Due to the incomplete occupation of k-space in the phase-coding direction 50 that is then possible, a speed-up of the image production with a maximum factor of nFov then occurs. With four individual antennas 6A, 6B, 6C, 6D, the exemplary arrangement shown in FIG. 1 thus provides an nCh=4 and a trebly divided imaging region FOV with nFov=3.

Magnetic resonance signals of the voxels $m_1, m_2, \ldots, m_{nFov}$ are received by all individual antennas. a reception signal of a $k^{th}$ individual antenna $s_k$ is composed of the signals from m1 through $m_{nFov}$:

$$s_k = \sum_{iFov=1\ldots nFov} PiCh \cdot iFov \cdot m_{iFov} \text{ for } k = 1 \ldots nCh$$

wherein PiCh,iFov is the antenna profile of the $iCh^{th}$ element for the image pixel $m_{iFov}$ in the $iFov^{th}$ sub-region. This relationship can be written in matrix form:

$$\begin{pmatrix} s_1 \\ s_2 \\ \vdots \\ s_{nCh} \end{pmatrix} = \begin{pmatrix} P1,1 & P1,2 & \cdot & \cdot \\ P2,1 & P2,2 & \cdot & \cdot \\ \vdots & \vdots & \vdots & \vdots \\ \cdot & \cdot & \cdot & PnCh,nFov \end{pmatrix} \cdot \begin{pmatrix} m_1 \\ m_2 \\ \vdots \\ m_{nFov} \end{pmatrix}$$

or abbreviated as $$S = P \cdot M$$

In order to be able to solve the equation, $$nCh \geq nFov$$

must apply.

A simple example of the equation system to be solved is the case nCh=nFov. In this case, the number of individual antennas is equal to the acceleration factor nFov and the solution for the matrix M can be unambiguously recited as:

$$M = P^{-1} \cdot S$$

The equation system is over-defined for nCh>nFov and is solved, for example, according to the least squares method. The classic algebraic solution for this problem is:

$$M = W \cdot S = (P^{T*} \cdot P)^{-1} \cdot P^{T*} \cdot S$$

wherein W represents the weighting matrix for the parallel acquisition method corresponding to $$W = (P^{T*} \cdot P)^{-1} \cdot P^{T*}$$

and $P^{T*}$ represents the transposed, complex conjugate of the matrix P.

This means the signal matrix S, weighted with the weighting matrix W yields the sought magnetization M. The fold-over artifacts thus are eliminated completely in the ideal case. If nCh is greater than nFov, the additional degree of freedom is used in order to optimize the signal-to-noise ratio. It is thereby assumed that the noise sources of the individual antennas are not correlated with one another.

The above-described signal processing assumes that the calculated profiles P agree exactly with the actual antenna profiles. This does not always apply in reality. For picture elements where the signal intensity of the magnetic resonance exposure is not adequately present compared to the noise, the antenna profiles P cannot be exactly determined, and the weighting matrix, as a result, also is not optimized with respect to the signal-to-noise ratio.

A goal of the present invention is to determine an optimized weighting factor $$W_{kFov} = (W_{kFov,1} \; W_{kFov,2} \; \ldots \; W_{kFov,nCh})$$

for the respective $kFov^{th}$ sub-region, taking into consideration that the antenna sensitivity profiles are determined from an in vivo measurement with reduced resolution. Thus, there are also regions where the tissue only weakly contribute to the imaging or regions that do not contain any imaging tissue at all. In order to take this into consideration, a target function is defined that contains the sum of the noise power and artifact power (fold-over artifacts). A weighting matrix is then defined wherein the noise power and the artifact power are optimized in common.

The signal intensity for a point in the kFov$^{th}$ sub-region of the element iCh is referenced $\hat{P}$iCh,kFov. In order to express the signal processing in general terms, the matrix $\hat{P}$ must also be defined:

$$\hat{P} = \begin{pmatrix} \hat{P}1,1 & \hat{P}1,2 & \cdot & \cdot \\ \hat{P}2,1 & \hat{P}2,2 & \cdot & \cdot \\ \vdots & \vdots & \vdots & \vdots \\ \cdot & \cdot & \cdot & \hat{P}nCh, nFov \end{pmatrix} \text{ or }$$

$$\hat{P}_{kFov} = \begin{pmatrix} \hat{P}1, kFov \\ \hat{P}2, kFov \\ \vdots \\ \hat{P}nCh, kFov \end{pmatrix}$$

The difference between the matrices P and $\hat{P}$ is comprised therein that the matrix P contains only the pure antenna profiles, whereas $\hat{P}$ also contains the corresponding tissue contrast, i.e. the actual image intensity.

Let it be assumed that the sought weighting matrix for the k$^{th}$ Fov is W$_k$. The fold-over artifact of the signal intensity from the i$^{th}$ Fov into the K$^{th}$ Fov can be estimated with the definition of $\hat{P}$ as:

$$F_i = |W_k \cdot \hat{P}_i|^2$$

Alternatively, the fold-over artifacts can be defined as follows:

$$F = \left| \sum_{\substack{i=1..nFov \\ i \neq k}} W_k \cdot \hat{P}_i \right|^2$$

However, the first-cited definition of the fold-over artifacts shall be employed below.

The term Wk·$\hat{P}_k$ not contained in the above equation is the actual term that one would like to solve for, as Signal:

Signal=$W_k \cdot \hat{P}_k$

The noise intensity for the k$^{th}$ Fov can be expressed as $R = W_k^* \cdot W_k^T N$ wherein N represents the noise power of the individual antenna elements. W$_k$* denotes the conjugate complex of W$_k$. It is thereby assumed that the noise level difference of the raw data of the individual antenna elements 1 through nCh and the noise correlation already has been eliminated by a noise de-correlation matrix.

Since the noise R and the convolution F are to be simultaneously minimized, the following target function is defined:

$$\frac{R+F}{|Signal|^2} \rightarrow \min$$

This target function for the first-cited definition of the fold-over artifacts F achieves its minimum when the weighting matrix is defined as follows:

$$\hat{W}_{kFov} \propto (I \cdot N + P^{T*} \hat{P})^{-1} \cdot P^{T*}_{kFov}$$

with a unit matrix I.

The basic features of this determination of the weighting factors are:
1. The matrix $\hat{P}$ contains not only the antenna sensitivity profiles but also the tissue contrast, whereas the known solution contains only the antenna sensitivity profiles.
2. Additionally, a term I·N is taken into consideration. Noise power and artifact power are thus minimized together. In contrast to the conventional method, the solution is no longer completely artifact-free; the sum of the artifact power and noise power, however, is lower than in the conventional method.
3. The factor N (noise) provides the possibility of setting the priority between better signal-to-noise ratio (SNR) or less artifact power. When the value N is increased, the weighting matrix is optimized primarily as to SNR and artifact power is taken into consideration only with lower priority. When, however, N is reduced, the artifacts are correspondingly taken into consideration more than the noise power.
4. According to the above relationship, only one weighting matrix for optimum signal-to-noise ratio and artifact together can be identified. In order to achieve the overall image with a specific intensity distribution, the weighting matrix must be normalized. The matrix $\hat{P}$ is thereby employed as a test function and is weighted with the factors, which are elements weighting matrix $W_{kFov} \cdot \hat{P}_{kFov}$
The intensity distribution of the resulting image should, for example, exactly correspond to the "root of the sum of the squares" $\sqrt{P_{kFov}^{T*} \cdot P_{kFov}}$, i.e.

$$W_{kFov} \cdot \hat{P}_{kFov} = \sqrt{\hat{P}_{kFov}^{T*} \cdot \hat{P}_{kFov}}$$

This is a scalar equation; it can be solved by introducing a corresponding factor for W$_{kFov}$. The matrix W is completely defined as W=(W$_1$ ... W$_{kFov}$ ... W$_{nFov}$), wherein $$W_{kFov} = \frac{\sqrt{\hat{P}_{kFov}^{T*} \cdot \hat{P}_{kFov}}}{\hat{W}_{kFov} \cdot \hat{P}_{kFov}} \cdot \hat{W}_{kFov}$$

with 1≤kFov≤nFov.

Figure 3:
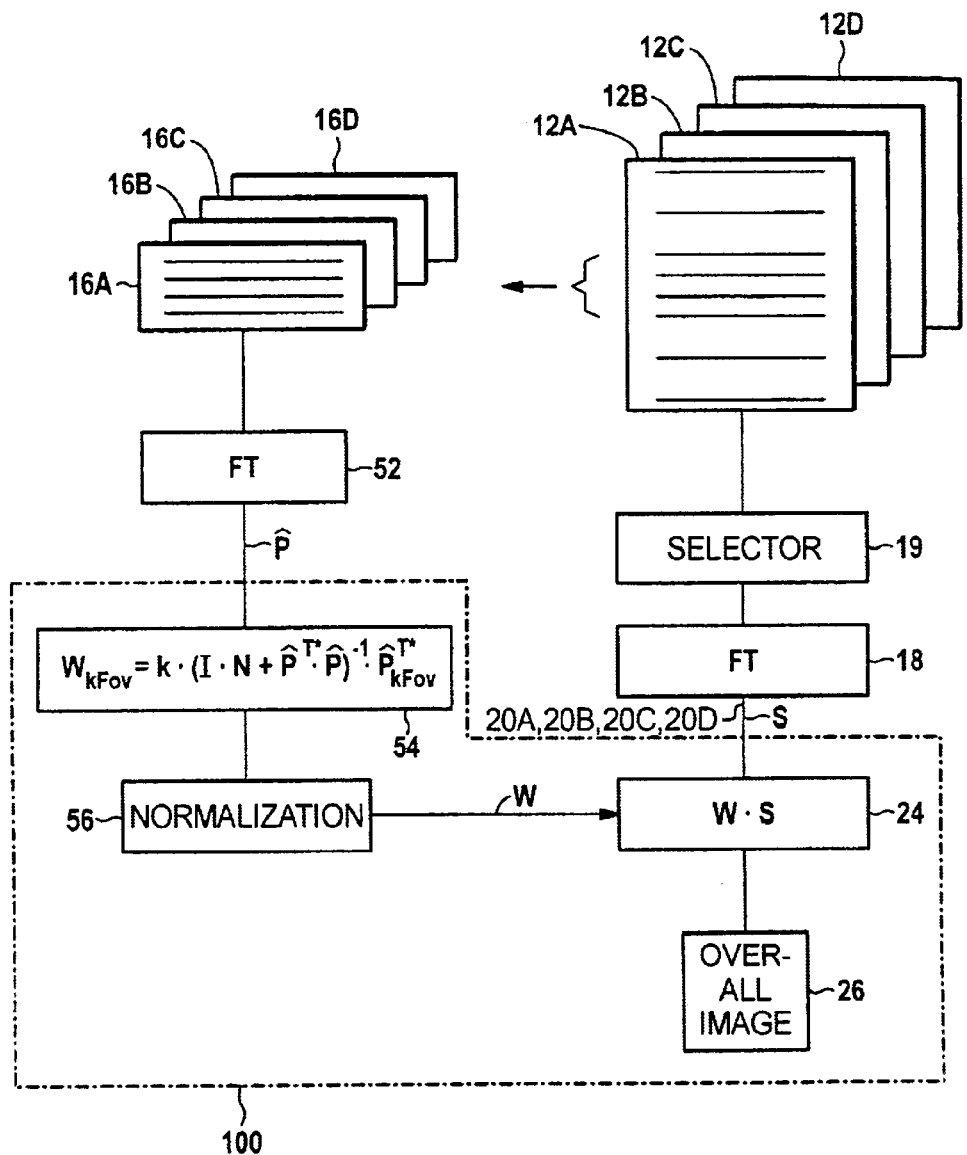
FIG. 3 is a flowchart showing a first exemplary embodiment for determining the weighting matrices in accordance with the invention.

FIG. 3 shows a first embodiment with the basic signal processing steps in order to determine the noise-optimized weighting matrix W from the k-space datasets 12A, 12B, 12C and 12D. The k-space datasets 12A, 12B, 12C and 12D for determining the weighting matrix and the image signals are determined with the same sequence as was already explained on the basis of FIG. 1. The middle and completely occupied k-space regions 16A, 16B, 16C, 16D are respectively subjected to a Fourier transformation 52 in order to obtain coarsely resolved image signals $\hat{P}$ allocated to the array antennas 6A, 6B, 6C, 6D. In a further signal processing step 54, the weighting matrix W is determined for a constant factor k from the coarsely resolved image signals. In a normalizing step 56 the weighting matrix also is normalized such that a uniform intensity distribution is present in the overall image 26. A fold-over artifact-free overall image 26 is then generated by weighted superimposition, from the artifact-affected intermediate images 20A, 20B, 20C and 20D with the weighting matrix W determined in this way.

Figure 4:
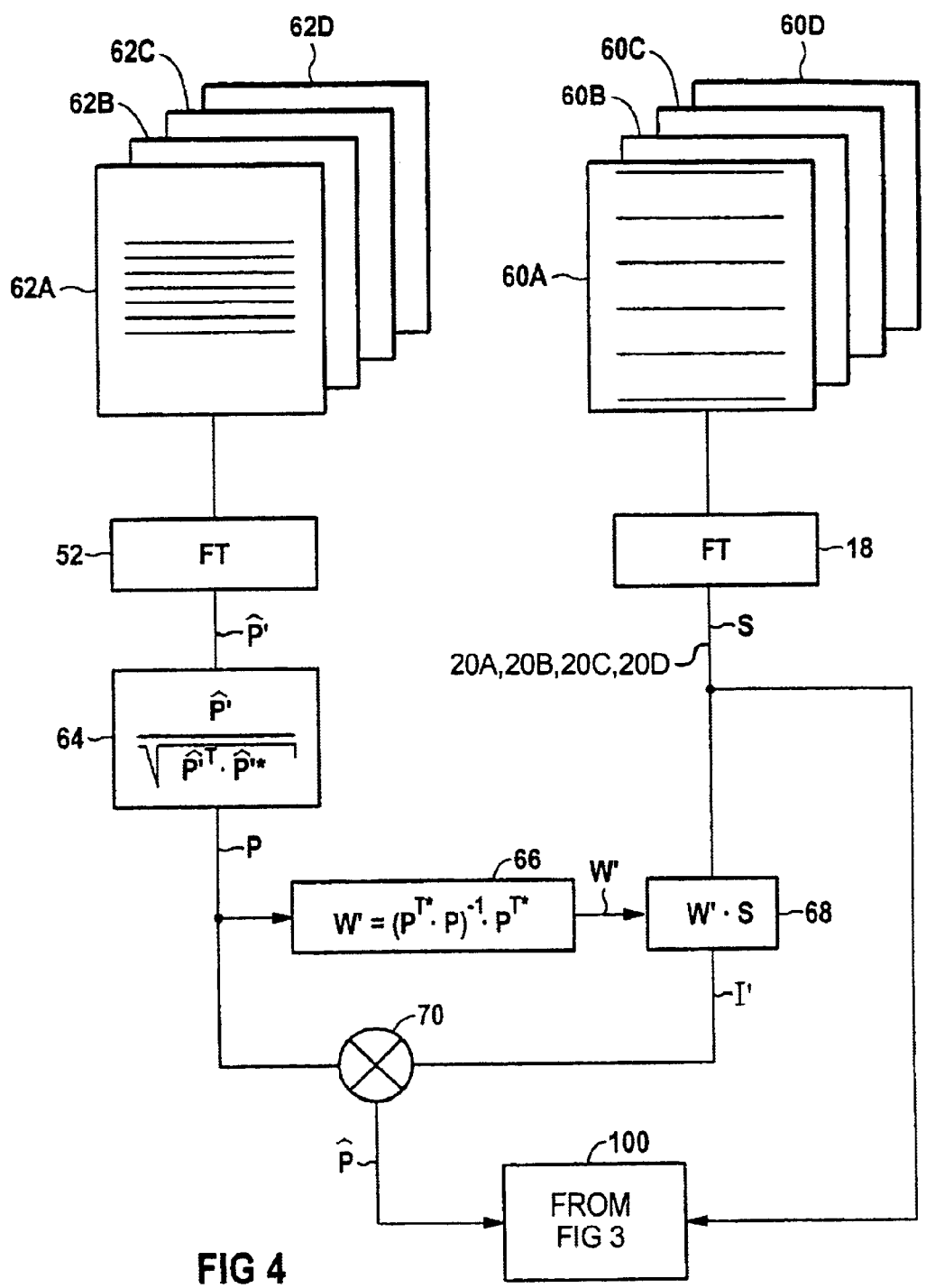
FIG. 4 is a further flowchart showing a second exemplary embodiment for determining the weighting matrices in accordance with the invention.

The method steps of a second embodiment are explained on the basis of FIG. 4, wherein incompletely sampled image signals 60A, 60B, 60C and 60D and coarsely resolved, convolution-free image signals 62A, 62B, 62C and 62D are generated with different sequences. Different contrast conditions thus are generally present in the two datasets. In order to compensate for this, intermediate weighting factors W' are first determined without taking the noise into consideration.

After a Fourier transformation 52 of the datasets 62A, 62B, 62C and 62D—as was also the case in the method according to FIG. 3—coarsely resolved intermediate images $\hat{P}'$ are defined. Differing from the method according to FIG. 3, antenna profiles P are first determined in the method step 64 from the coarsely resolved intermediate image $\hat{P}'$. In method step 66, the intermediate weighting matrix W' is determined from the antenna sensitivity profiles P according to the relationship $$W' = (P^{T*} \cdot P)^{-1} P^{T*}$$

With the assistance of the intermediate weighting matrix W', a reconstruction of a convolution-free image I' then ensues in method step 68. This, however, exhibits a poor signal-to-noise ratio. In method step 70, the coarsely resolved image intensities $\hat{P}$ are then determined from the antenna profiles P and the convolution-free image I' with poor signal-to-noise ratio. The coarsely resolved image intensities $\hat{P}$ that are now present thus have the same contrast as the overall image 26 that is not to be subsequently reconstructed. The weighting matrix can thus be determined and normalized taking the noise into consideration, as already explained with reference to FIG. 3. The overall image 26 can now be reconstructed with the weighting matrix optimized in view of the fold-over artifacts and noise. The corresponding method steps are combined in a dot-dash box 100 in FIG. 3.

Although modifications and changes may be suggested by those skilled in the art, it is the intention of the inventor to embody within the patent warranted hereon all changes and modifications as reasonably and properly come within the scope of the inventor's contribution to the art.

I claim as my invention:

1. A method for generating a magnetic resonance image of a subject, comprising:

emitting radio-frequency excitation pulses and gradient pulses, including phase-coding gradients, into an imaging region in which a subject is disposed, said imaging region being divided into a plurality of partial imaging regions, for generating location-coded magnetic resonance signals in said subject, said phase-coding gradients incompletely location coding said magnetic resonance signals in a phase-coding direction;

simultaneously receiving said magnetic resonance signals with a plurality of reception antennas, as respective reception signals, and for each of said reception signals forming a k-space dataset;

reconstructing an intermediate image from each of said k-space datasets, each intermediate image containing fold-over artifacts due to the incomplete location coding in the phase-coding direction;

for each of said antennas, acquiring an intermediate weighting image of said subject and determining from said intermediate weighting images a weighting matrix, which is simultaneously minimized to noise and fold-over artifacts with respect to a reconstructed overall weighting image formed by said intermediate weighting images;

combining said intermediate images using said weighting matrix to form, exclusively from said intermediate image and said weighting matrix, a noise-minimized, fold-over artifact-free overall image of said subject.

2. A method as claimed in claim 1 comprising taking the fold-over artifacts into account in said weighting matrix by a sum of squares of magnitudes of individual fold-over artifacts in the respective sub-regions.

3. A method as claimed in claim 1 comprising taking the fold-over artifacts into account in said weighting matrix by a square of the sums of magnitudes of individual fold-over artifacts in the respective sub-regions.

4. A method as claimed in claim 1 comprising defining said weighting matrix as $$W = (W_1 \ldots W_{kFov} \ldots W_{nFov}),$$

wherein $$W_{kFov} = \frac{\sqrt{\hat{P}_{kFov}^{T*} \cdot \hat{P}_{kFov}}}{\hat{W}_{kFov} \cdot \hat{P}_{kFov}} \cdot \hat{W}_{kFov}$$

wherein $$\hat{W}_{kFov} \propto \left(I \cdot N + P^{T*} \hat{P}\right)^{-1} \cdot P_{kFov}^{T*}$$

wherein

I is a unit matrix,
N is the noise power of the individual antennas,
$\hat{P}$ is the intermediate weighting image, and
$\hat{P}^{T+}$ is the transposed, conjugated complex of said intermediate weighting image.

5. A method as claimed in claim 1 comprising normalizing each of said weighting matrices making the intermediate weighing image multiplied by said weighting matrix equal to the square root of the sum of the squares of the intermediate weighting image.

6. A method as claimed in claim 1 comprising acquiring said fold-over artifact-free intermediate weighting images from magnetic resonance signals generated in said subject that are completely phase-coded in a low-frequency region.

7. A method as claimed in claim 1 comprising acquiring said fold-over artifact-free intermediate weighting images and said magnetic resonance signals with respective image sequences which are the same, with said location coding in the phase-coding direction being complete in a low-frequency region and being incomplete in an adjoining higher frequency region.

8. A method as claimed in claim 1 comprising acquiring said intermediate weighting images and said intermediate images with different pulse sequences.

* * * * *